(12) United States Patent
Yazici et al.

(10) Patent No.: US 9,324,745 B2
(45) Date of Patent: Apr. 26, 2016

(54) LARGE FORMAT SHORT WAVE INFRARED (SWIR) FOCAL PLANE ARRAY (FPA) WITH LOW NOISE AND HIGH DYNAMIC RANGE

(71) Applicant: SABANCI ÜNIVERSITESI, Tuzla, Istanbul (TR)

(72) Inventors: Melik Yazici, Istanbul (TR); Ömer Ceylan, Istanbul (TR); Hüseyin Kayahan, Istanbul (TR); Yasar Gürbüz, Istanbul (TR)

(73) Assignee: SABANCI ÜNIVERSITESI, Tuzla, Istanbul (TR)

( * ) Notice: Subject to any disclaimer, the term of this patent is extended or adjusted under 35 U.S.C. 154(b) by 0 days.

(21) Appl. No.: 14/650,030

(22) PCT Filed: Dec. 7, 2012

(86) PCT No.: PCT/EP2012/074798
§ 371 (c)(1),
(2) Date: Jun. 5, 2015

(87) PCT Pub. No.: WO2014/086430
PCT Pub. Date: Jun. 12, 2014

(65) Prior Publication Data
US 2015/0319391 A1    Nov. 5, 2015

(51) Int. Cl.
*H04N 5/335*    (2011.01)
*H01L 27/146*    (2006.01)
*H04N 5/33*    (2006.01)
*H04N 5/3745*    (2011.01)
*H04N 5/378*    (2011.01)

(52) U.S. Cl.
CPC ............ *H01L 27/14609* (2013.01); *H04N 5/33* (2013.01); *H04N 5/3355* (2013.01); *H04N 5/378* (2013.01); *H04N 5/37455* (2013.01)

(58) Field of Classification Search
CPC ..................................................... H04N 5/3355
See application file for complete search history.

(56) References Cited

U.S. PATENT DOCUMENTS

2004/0207739 A1    10/2004 Rossi

FOREIGN PATENT DOCUMENTS

| JP | H09184823 A | 7/1997 |
|---|---|---|
| WO | 0237830 A2 | 5/2002 |
| WO | 2006073875 A2 | 7/2006 |

*Primary Examiner* — Gary C Vieaux
(74) *Attorney, Agent, or Firm* — Epstein Drangel LLP; Robert L. Epstein

(57) ABSTRACT

The present invention presents unit cell architecture for infrared imaging, which has two input stages covering for both low and high light levels, and automatic input selection circuitry inside to extend dynamic range. The invention mainly helps to extend dynamic range of near visible (NIR) and short wave infrared (SWIR) image sensors by improving SNR value. The idea is applicable to not only infrared bands including NIR, SWIR, MWIR and LWIR but also full spectrum light.

15 Claims, 5 Drawing Sheets

# LARGE FORMAT SHORT WAVE INFRARED (SWIR) FOCAL PLANE ARRAY (FPA) WITH LOW NOISE AND HIGH DYNAMIC RANGE

TECHNICAL FIELD OF THE INVENTION

The present invention presents a unit cell architecture for infrared imaging, which has two input stages covering for both low and high flux levels, and automatic input selection circuitry inside pixel to extend dynamic range.

BACKGROUND OF THE INVENTION

The present invention presents a unit cell architecture for infrared imaging. The invention helps to extend dynamic range of near infrared (NIR) and short wave infrared (SWIR) image sensors by improving SNR value. This invention method can be applied not only infrared spectrum bands (SWIR, MWIR, LWIR . . . ) but also full spectrum light.

While a plurality of prior art references are pertinent in the field, U.S. Pat. No. 7,551,059 discloses two different input stages inside a single unit cell. One should be optimized for high and other should be for low light levels. One should be in the form of a lower gain wide dynamic range amplifier and the other should be high gain lower dynamic range amplifier. Separate outputs are present for each amplifier. The unit cell can be used for dual color detectors. The same disclosure is also published for an APS CMOS sensor readout (U.S. Pat. No. 7,616,231). The disclosure referenced herein is disadvantageous in that examples and architectures are only analog and no automatic selection circuit unit cell is presented.

Another reference U.S. Pat. No. 7,492,399, on the other hand, demonstrates need for two different input stages inside the unit cell to improve dynamic range and optimize SNR performance. The disclosure gives one specific circuit model that consists of CTIA (Capacitive Transimpedance Amplifier) and SFD (Source Follower per Detector) input stages for NIR/SWIR. Further, it is disadvantageous in that there is no automatic selection circuit and models are only analog circuit.

According to the present invention, automatic selection of input stage improves dynamic range because the best input stage amplifier is selected according to light level. And this operation is at unit cell level such that each pixel selects input stage meaning that greater dynamic range and flexibility is obtained. It is further important to note that a given user manually selects input stage according to needs. Manually selected input stage affects whole array. The two input stage architecture can be used for dual band or dual color detectors. In sum, this brings great flexibility to the architecture.

OBJECTS OF THE PRESENT INVENTION

Primary object of the present invention is to extend dynamic range of near visible (NIR) and short wave infrared (SWIR) image sensors by improving SNR value at pixel level.

SUMMARY OF THE INVENTION

The present invention helps to extend dynamic range of near visible (NIR) and short wave infrared (SWIR) image sensors by improving SNR value.

The invention proposes both automatic input stage selection circuit and manual selection mode for providing user flexibility. Automatic input stage circuit can be implemented in both analog and digital circuit domains. The invention is not only used for single sensors but also used for dual band sensors due to the fact that two different input stages are presented.

The unit cell architecture of the present invention claims optimization of SNR level depending on incoming light level. For instance, more than $10^{10}$ illumination level is presented between NIR and SWIR spectrum. In mainstream unit cells, a single optimized input stage is present but optimization range thereof and performance is poor. Specifically, a capacitive transimpedance amplifier unit cell covers widest range but its SNR performance is not the best for the whole NIR/SWIR range. However a SFD (Source Follower per Detector) unit cell provides best SNR high light levels like some portion of SWIR. Thus, each input stage is differently optimized for light levels. By utilizing two input stage for low and high light levels, better SNR values can always be acquired, this also leading to wide dynamic range for sensor. This type of wide dynamic range sensors are available and will be more and more so in near future due to the fact that the NIR/SWIR range is very popular considering low cost and extensive use in areas other than LWIR and MWIR bands.

In a more general sense, there are two input stage amplifiers, one covering for low light levels and the other being optimized for high light levels. There is an automatic control circuit inside the unit cell to determine which input stage is to be used according to light level. Light intensity is determined by two level integration. First integration is very short with respect to the other actual integration. By using data obtained from said first integration, light level is being determined and intended input stage is accordingly used.

In another method, flux information from previous integration is used for selecting present input stage. In previous integration if incoming flux level was low, in the present integration low flux optimized input stage is selected. When low flux optimized input stage is selected but incoming flux level is high, in the next integration high flux level optimized input stage is selected.

This invention improves dynamic range due to the reason that each pixel chooses the best input stage only according to the light information and the best input stage gives the best SNR for that light level. For instance, objects inside very bright and dark levels can be identified in a single image.

The invented unit cell architecture is not only used for wide dynamic range sensors but also used for dual color sensors. Since it has two different input stages, dual color sensors are compatible with this structure. Thus, this architecture brings more flexibility to users.

BRIEF EXPLANATION OF THE DRAWINGS

Accompanying drawings are given solely for the purpose of exemplifying a unit cell architecture for infrared imaging whose advantages over prior art were outlined above and will be explained hereinafter in brief. The drawings are not meant to delimit the scope of protection as identified in the claims nor should they be referred to alone in an effort to interpret the scope identified in said claims without recourse to the technical disclosure in the description of the present invention.

Figure 5:
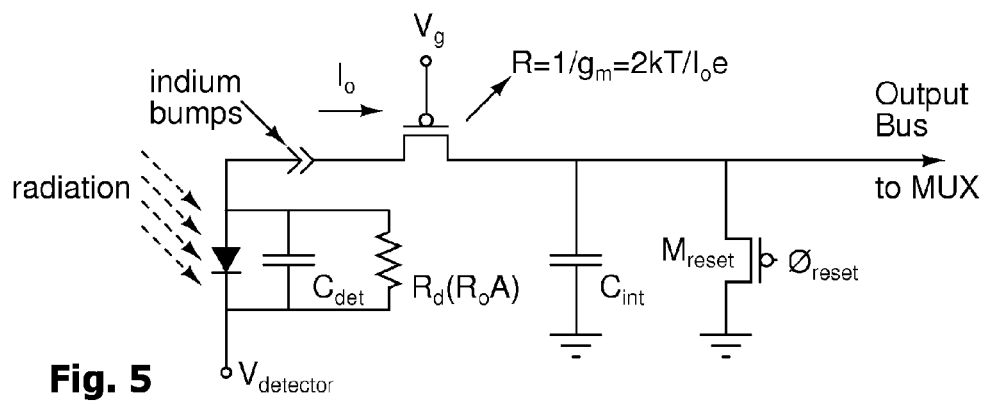
Figure 6:
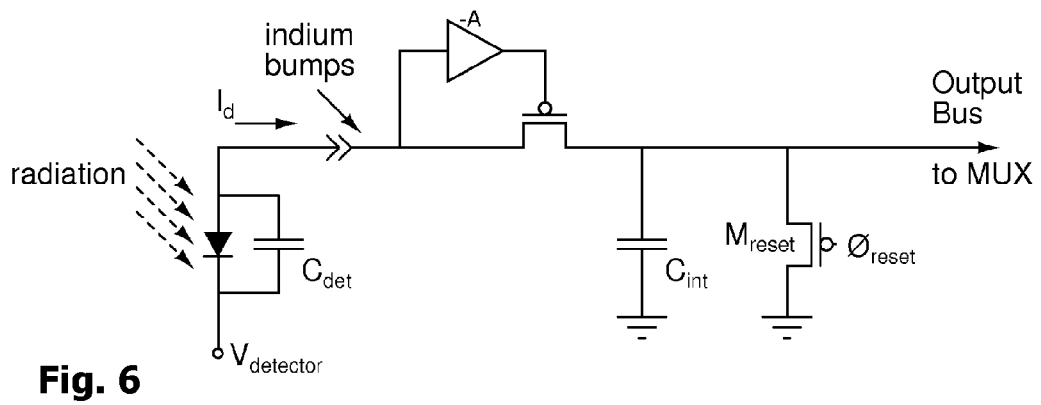

While FIG. 5 demonstrates a direct injection circuit inside the analog unit cell, FIG. 6 demonstrates a buffered direct injection circuit inside the analog unit cell.

Figure 7:
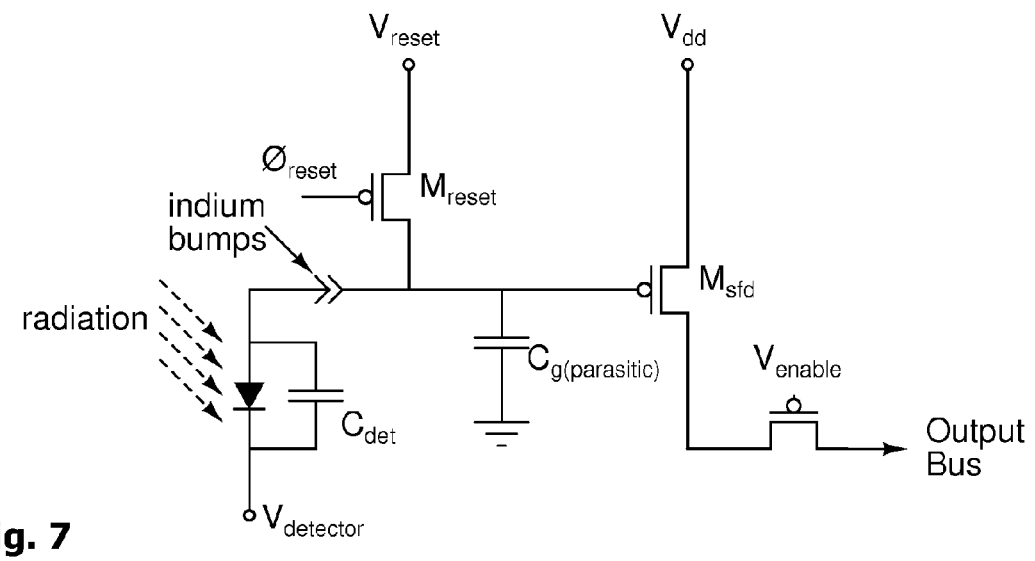

FIG. 7 demonstrates the SFD (Source Follower per Detector) architecture.

Figure 8:
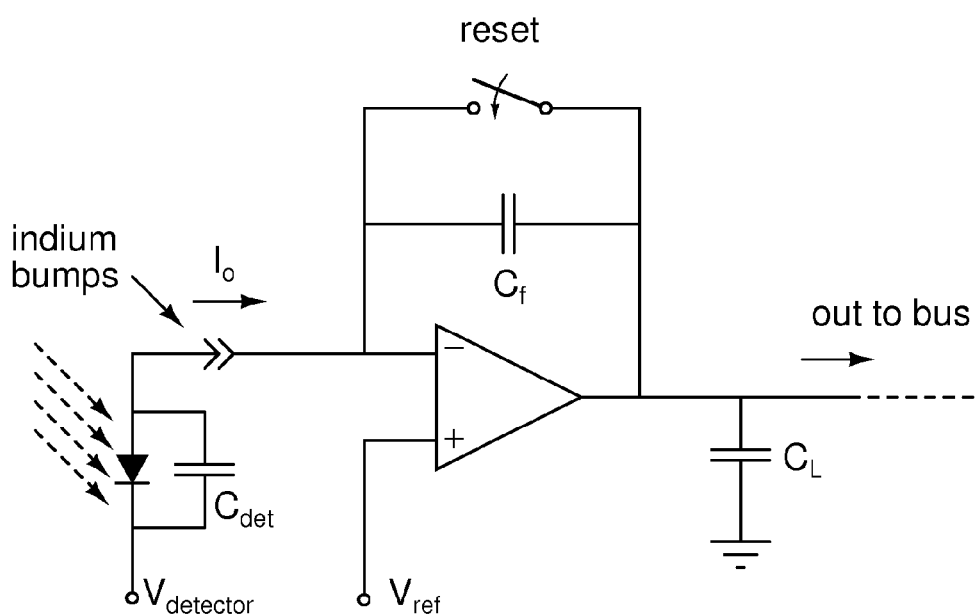

FIG. 8 demonstrates the CTIA (Capacitive Transimpedence Amplifier) architecture.

Figure 9:
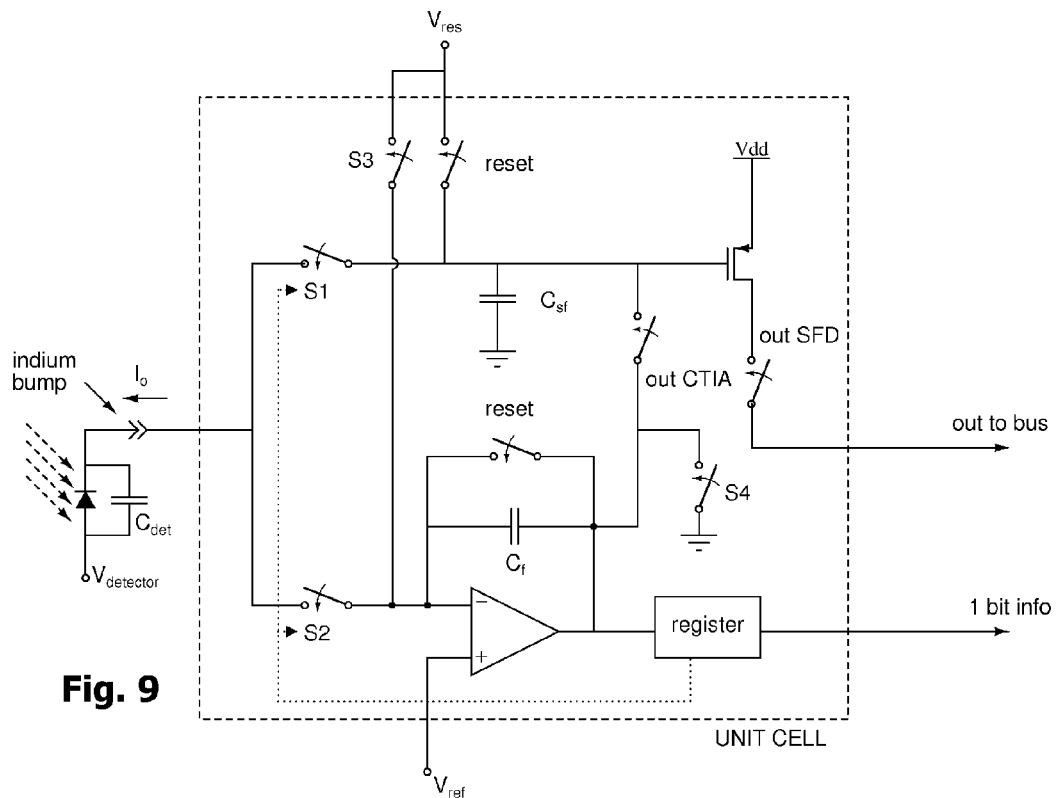

FIG. 9 demonstrates an implementation of an analog block diagram where CTIA and SFD used together according to the present invention.

Figure 10:
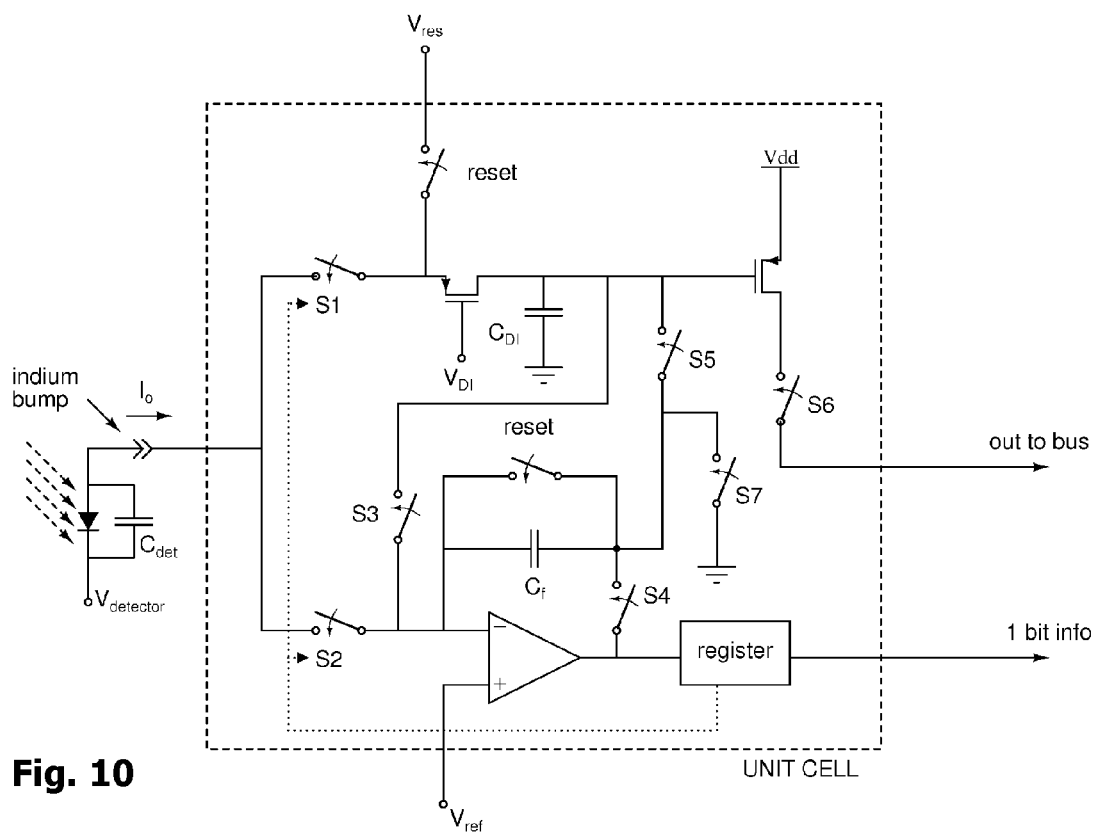

FIG. 10 demonstrates an implementation of a block diagram where DI and CTIA are used together according to the present invention.

Figure 11:
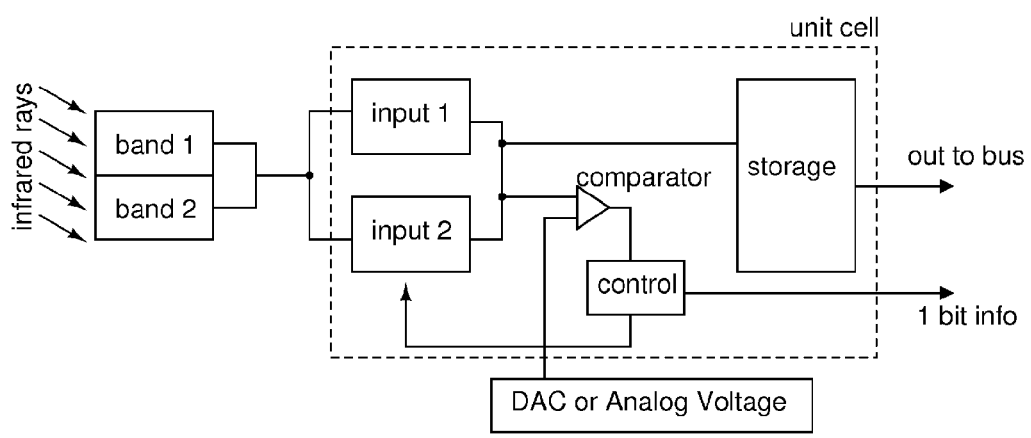

FIG. 11 represents a dual band implementation in which two different wavelengths are captured according to the present invention.

DETAILED DESCRIPTION OF THE INVENTION

Figure 1:
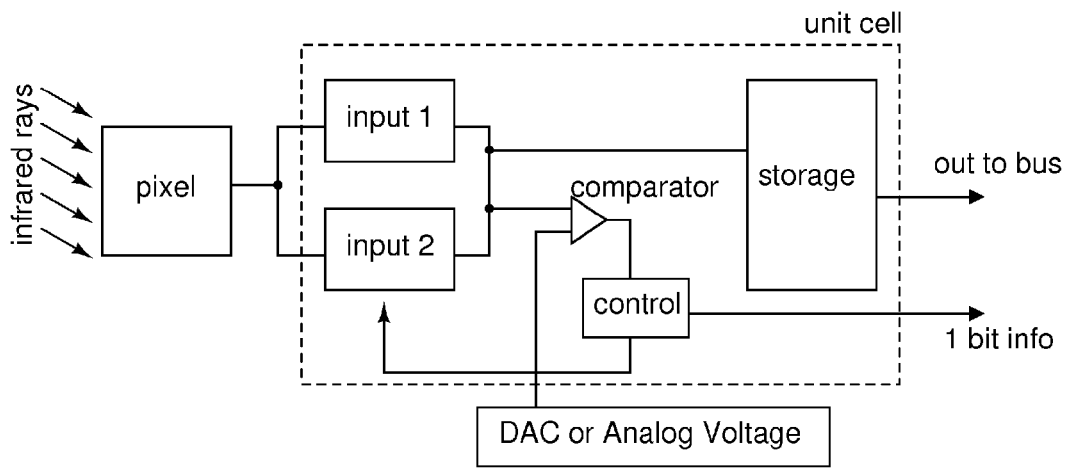
FIG. 1 demonstrates the simple analog architecture of the system according to the present invention.

Now referring to the figures whose brief explanations are given above, FIG. 1 indicates the simple analog architecture according to the present invention. The sensor being an infrared detector and input stages being replaceable by Direct Injection (DI), Buffered Direct Injection (BDI), SFD and CTIA input stages, the integration time, in this architecture, is divided by two in a non-equal manner in the sense that the first one is short and the other integration is longer compared to the first one.

In the first integration, a comparator compares voltage level with respect to a reference in order for determining incoming light level. Voltage reference can be generated by a DAC or given by the analog voltage source in FIG. 1. The control circuit therein determines which input circuit should be activated for the second integration. Then information as to the first and the second integration is stored in capacitors. One bit digital information is used for the input stage being selected. This information can be useful for digital signal processing to apply some adjustments to image or video.

Figure 2:
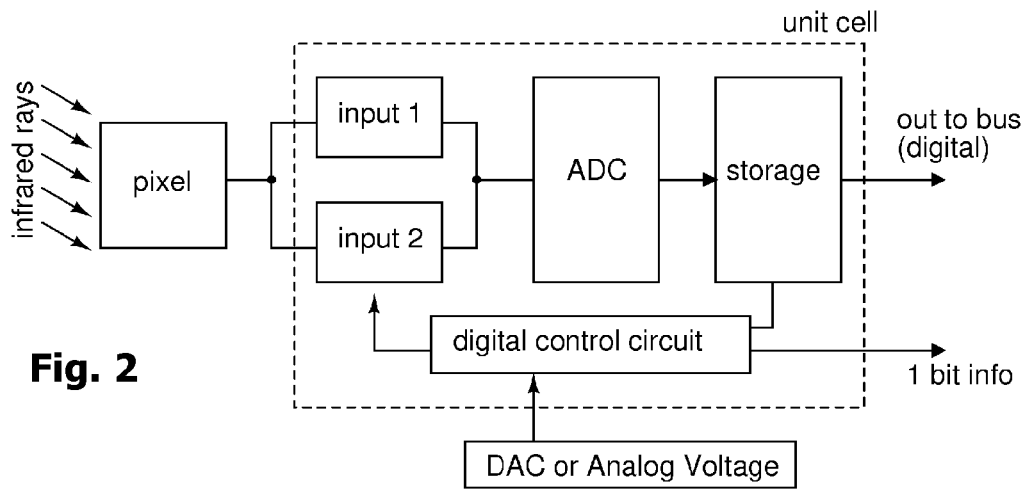
FIG. 2 demonstrates the digital architecture of the system according to the present invention.

According to the present invention, FIG. 2 demonstrates the digital architecture of the system. This architecture works in two ways; the first one is similar to the two step integration method as explained in association with FIG. 1 having analog architecture. The second approach is based on the use of information obtained from a previous data set. In other words, in this method, the input stage to be activated is selected by previous photo current data. If the previous value is lower than a certain threshold, then the first input stage is selected, otherwise the other input stage is selected by said control circuit. This threshold level can be controlled by the DAC. Hysteresis mod can be added to reduce instant changes. It prevents changing selected stage instantly. Similar to the analog block diagram, a one bit information stores which input stage is selected. In this unit cell, all output data is digital.

Figure 3:
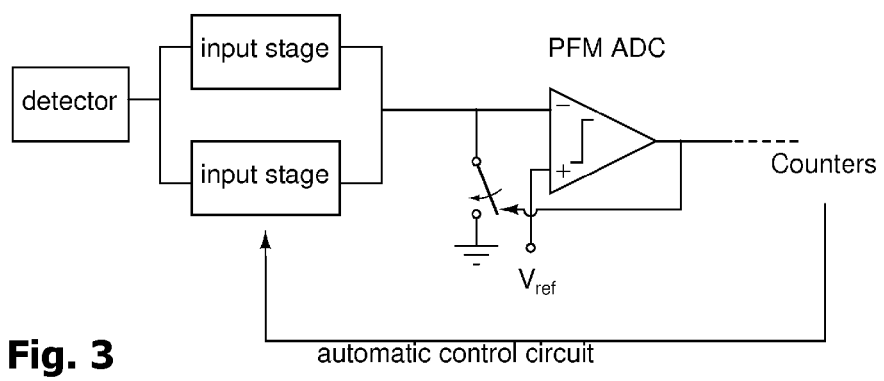
FIG. 3 demonstrates a digital implementation of the system according to the present invention.
Figure 4:
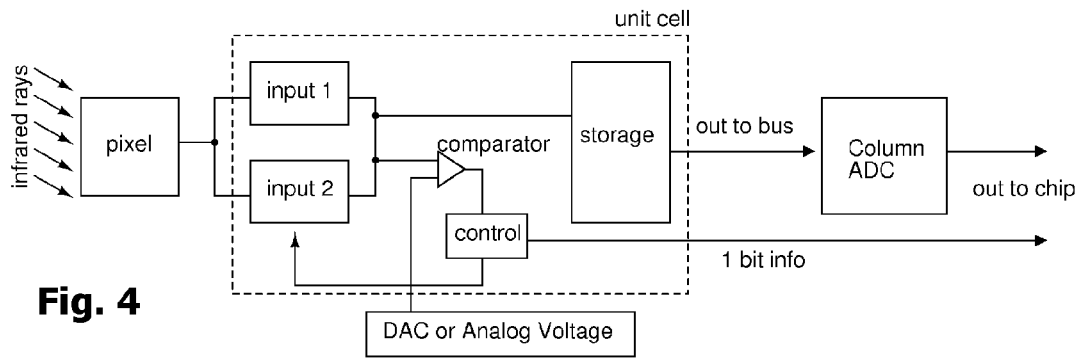
FIG. 4 demonstrates an alternative embodiment in association with the digital implementation of the system as to FIG. 3.

FIG. 3 represents a possible digital implementation according to the invention. A pulse frequency modulation (PFM) ADC is used in this unit cell. Digital storage is implemented by counters and the control circuit checks bits inside counters to determine light level and accordingly selects the input stage. An alternative to this implementation method is a hybrid one as in FIG. 4, i.e. half analog and half digital. After the analog block outside the unit cell, a column based ADC is used and information is hence converted into digital form. Along with the one bit information output of ROIC is all digital.

There are a number of possible input stage architectures, one of them being direct injection (DI). Such architectures are briefly referred to in this section of the detailed description. FIG. 5 demonstrates a direct injection circuit inside the analog unit cell. DI consists only of a single transistor; it can be mostly used for LWIR detector but not limited to it. It is known to have the best noise performance but input efficiency thereof is limited. FIG. 6, on the other hand, is a buffered DI (BDI). It is known to amplify photocurrent greatly and has possible usage in SWIR detectors. FIG. 7 demonstrates the SFD (Source Follower per Detector) architecture, which is popular in SWIR applications. It has not much wide dynamic range for SWIR band and its gain is limited. Noise performance, however, is superior to CTIA. The CTIA architecture (Capacitive Transimpedence Amplifier) in FIG. 8 covers a very wide range for NIR and SWIR since it has a very large gain due to the nature of the amplifier. Input efficiency is also high but noise performance is not as good as SFDs. Any of the architectures of FIGS. 5 to 8 can be used as an input stage for the proposed system.

FIG. 9 represents implementation of an analog block diagram according to the present invention. In this implementation, SFD and CTIA cells are used inside the unit cell and wherein CTIA is used as a comparator in the manner that a space saving implementation amplifier is adopted. S1 and S2 switches determine SFD or CTIA being used.

When CTIA is used for comparator input stage selection, respective information is created with respect to $V_{ref}$ information. S3 becomes active end set $C_f$ for a certain level and S4 switch provides $C_f$ path to gnd. "out CTIA" and "out SFD" switches are used for transferring information to "out to bus". Output of CTIA is buffered by SFD. $C_{sf}$ and $C_f$ are storage capacitors of SFD and CTIA respectively. $C_f$ is smaller than $C_{sf}$ because CTIA is optimized for low light levels. For low light levels a smaller capacitance value is preferred and a smaller integration capacitance improves kTC noise performance. On the other hand, for handling high light levels $C_{sf}$ capacitance is considered high.

$V_{ref}$ level is used to attain two different purposes: one is to determine light level and the other is to determine CTIA integration level. $C_f$ capacitance is determined by $V_{ref}$ register. Output of maximum SFD becomes $V_{DD}$ level and output of maximum CTIA becomes $V_{ref}$ level.

When using maximum range control, one bit information is required to determine which input stage is used. If maximum level of SFD is used as $V_{ref}$ and rest of the range is used for CTIA (pre-dividing $0-V_{DD}$ levels between CTIA and SFD by using $V_{ref}$), said one bit information is not needed as it can be determined which of said CTIA and SFD is used based on the outputs. In this way, $V_{ref}$ and $V_{res}$ levels can be used for adjusting CTIA and SFD voltage percentages to determine priority.

This architecture of FIG. 10 is very similar to the previous one and most of the architectural advantages are accordingly shared. Differently in this scheme, DI and CTIA are used together. Source follower is buffer for both input stages. In this way offset differences are prevented. Different than the previous one, output of DI is routed to input of CTIA for comparison mode. CTIA can also be used as a comparator without need of DI as in the previous circuit scheme; but alternative architecture is presented here. In comparison mode, S4 switch becomes inactive and S7 becomes active. S5 switch routes CTIA output to output bus through SFD. S6 switch routes to output bus.

FIG. 12 represents a dual band implementation. Two different wavelengths are captured by the detector and information as such is routed to respective input stage one by one through a single indium bump.

In a nutshell, the present invention proposes a unit cell according to which, there are two input stages which can be different in topology (DI, BDI, SFD, CTIA) or they can be designed using hybrid topology. But one of these is optimized for higher and the other one for low light levels. Automatic control circuit inside the unit cell determines the best input stage according to incoming light level. Automatic selection is an independent process inside each unit cell in a FPA. Automatic control circuit can be accomplished by analog or digital circuits depending on the unit cell structure.

Analog automatic control circuit comprises a comparator. The comparator compares light level with pre-determined or adjustable threshold level. Said comparator compares at first very shortly integrated photo current. According to this information, rest of photo current is integrated with selected input stage. Threshold function inside comparator can include hysteresis mode to prevent immediate changes.

Digital automatic control circuit checks previously integrated digital data. It selects input stage depending on that previous data. While determining flux level information, a threshold value is used in this effect. If the flux level is above the referred threshold value, high flux optimized input stage is used. In the other case, however, low flux optimized input stage is used. Instead of one constant threshold value hysteresis can be used to prevent immediate changes.

Analog or digital input selection can also select the best gain level according to photo current information. This ensures even more dynamic range.

Selected gain level information is transferred to outside said unit cell with one bit information. For each unit cell this information is registered to improve signal processing. Since unit cell has two input stage, it can be used for dual band detectors. Control circuitry inside the cell can enable dual band operation. Apart from automatic control circuit, a given user can manually select input stage for the whole FPA depending on user needs.

The invention claimed is:

1. A readout circuit unit cell comprising a first and a second input stage amplifiers coupled to a light detector input node, the first input stage amplifier for lower level light input levels compared to the second input stage amplifier for higher level light input levels, said readout circuit unit cell further comprising a unit cell level automatic input stage selection mechanism to select between two input stages amplifiers depending on light input levels by way of determining light intensity by integration and selecting one of said first or second input stage amplifiers as the input stage amplifier to be used in the manner that only one of said first or second input stage amplifiers is selected according to data obtained from a first integration, the selected one of said first or second input stage amplifiers being activated to effectuate a second integration, the two-level integration being effected in a non-equal manner such that the first integration duration is shorter with resect to the second integration duration.

2. A readout circuit unit cell as set forth in claim 1 wherein said input stage amplifiers are selected from DI, CTIA, SFD, BDI type of amplifier combinations.

3. A readout circuit unit cell as set forth in claim 1 wherein the first and second input stage amplifiers have at least two integration modes in the form of integrate-then-read (ITR) mode and integrate-while-read (IWR) mode.

4. A readout circuit unit cell as set forth in claim 1 wherein the first and second input stage amplifiers are connected to a radiation detector through a single indium bump and switch mechanisms whereby one of the input stage amplifiers is selected.

5. A readout circuit unit cell as set forth in claim 1 wherein said first and second input stage amplifiers comprise a charge to voltage conversion circuit.

6. A readout circuit unit cell as set forth in claim 1 wherein automatic input stage selection mechanism has a feedback mechanism to select an input stage amplifier based on light input levels of said detector.

7. A readout circuit unit cell as set forth in claim 6 wherein said feedback mechanism determines light input level with two stage integration in which a first stage integration for determining light level is shorter compared to a second one being actual integration.

8. A readout circuit unit cell as set forth in claim 6 wherein said feedback mechanism has a comparator device which compares detector input light level with respect to an adjustable reference voltage level to determine light input level to select one of said input stage amplifiers.

9. A readout circuit unit cell as set forth in claim 6 wherein one of said two input stage amplifiers is reusable as a comparator device.

10. A readout circuit unit cell as set forth in claim 9 wherein said comparator device applies hysteresis function.

11. A readout circuit unit cell as set forth in claim 7 wherein said reference voltage level gives priority to either of said input stage amplifiers.

12. A readout circuit unit cell as set forth in claim 7 wherein a one bit information indicative of input stage amplifier being selected is transferred outside said unit cell along with detector light input level information.

13. A readout circuit unit cell as set forth in claim 1 wherein said unit cell structure is either a digital readout integrated circuit or an analog readout integrated circuit.

14. A readout circuit unit cell as set forth in claim 13 wherein a pulse frequency modulator is used to convert input signal into digital bit values inside said unit cell as digital readout integrated circuit.

15. A readout circuit unit cell as set forth in claim 14 wherein a column based analog to digital converter is used inside said unit cell.

* * * * *